United States Patent
Miyamoto et al.

(10) Patent No.: US 10,367,009 B2
(45) Date of Patent: Jul. 30, 2019

(54) ACTIVE-MATRIX SUBSTRATE

(71) Applicant: SHARP KABUSHIKI KAISHA, Sakai, Osaka (JP)

(72) Inventors: Tadayoshi Miyamoto, Sakai (JP); Fumiki Nakano, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/579,178

(22) PCT Filed: Jun. 2, 2016

(86) PCT No.: PCT/JP2016/066363
§ 371 (c)(1),
(2) Date: Dec. 1, 2017

(87) PCT Pub. No.: WO2016/195001
PCT Pub. Date: Dec. 8, 2016

(65) Prior Publication Data
US 2018/0138205 A1    May 17, 2018

(30) Foreign Application Priority Data
Jun. 4, 2015 (JP) ................................ 2015-114062

(51) Int. Cl.
*H01L 27/12* (2006.01)
*H01L 27/32* (2006.01)
(Continued)

(52) U.S. Cl.
CPC ........ *H01L 27/124* (2013.01); *H01L 21/3205* (2013.01); *H01L 21/768* (2013.01);
(Continued)

(58) Field of Classification Search
CPC ............. G02F 1/136286; H01L 27/124; H01L 27/1225; H01L 27/1262; H01L 27/14663;
(Continued)

(56) References Cited

U.S. PATENT DOCUMENTS 6,480,577 B1    11/2002   Izumi et al.
6,512,263 B1 *   1/2003   Yuan ..................... H01L 27/115
                                                        257/315
(Continued)

FOREIGN PATENT DOCUMENTS

JP    H06-160904 A    6/1994
JP    2000-353808 A   12/2000
(Continued)

*Primary Examiner* — Dao H Nguyen
(74) *Attorney, Agent, or Firm* — ScienBiziP, P.C.

(57) ABSTRACT

Provided is an active-matrix substrate in which the line resistance is decreased. The active-matrix substrate includes a substrate 31, a plurality of gate lines Gj disposed on the substrate 31 and extending in a first direction, a plurality of source lines Si disposed on the substrate 31 and extending in a second direction different from the first direction, a transistor 2 disposed correspondingly to each of intersection points of the gate lines and the source lines Si and connected to a corresponding one of the gate lines Gj and a corresponding one of the source lines Si, an insulating layer, and extended conductive films 51, 52, and 61. At least ones of the gate lines Gj and the source lines Si each have a layered structure with connection to the extended conductive film via a contact hole provided in the insulating layer.

6 Claims, 15 Drawing Sheets

(51) Int. Cl.
*G02F 1/1362* (2006.01)
*H01L 21/768* (2006.01)
*H01L 23/522* (2006.01)
*H01L 27/146* (2006.01)
*H01L 29/786* (2006.01)
*H01L 21/3205* (2006.01)

(52) U.S. Cl.
CPC ........ *H01L 23/522* (2013.01); *H01L 27/1262* (2013.01); *H01L 27/14603* (2013.01); *H01L 27/14612* (2013.01); *H01L 27/14636* (2013.01); *H01L 27/14663* (2013.01); *H01L 27/14692* (2013.01); *H01L 29/786* (2013.01); *G02F 1/136286* (2013.01); *G02F 2001/13629* (2013.01); *H01L 27/1225* (2013.01); *H01L 27/3279* (2013.01); *H01L 29/7869* (2013.01)

(58) Field of Classification Search
CPC ........ H01L 27/14612; H01L 27/14636; H01L 27/14692; H01L 27/14603; H01L 27/3279; H01L 23/522; H01L 29/786; H01L 29/7869; H01L 21/768; H01L 21/3205
USPC ............ 257/72, 98, 40, 296, 316, 393, 773, 257/E27.084, E27.099, E27.103, E27.111, 257/E23.01, E51.018, E21.661, E21.682, 257/E21.69; 345/76, 211, 212; 349/38, 349/39, 46; 438/22, 34, 104, 241, 257
See application file for complete search history.

(56) References Cited

U.S. PATENT DOCUMENTS

| | | |
|---|---|---|
| 2001/0019374 A1 | 9/2001 | Izumi et al. |
| 2005/0253249 A1 | 11/2005 | Chen et al. |
| 2006/0289945 A1* | 12/2006 | Nii ........................... G11C 5/14 257/393 |
| 2007/0212824 A1 | 9/2007 | Chen et al. |
| 2010/0123253 A1* | 5/2010 | Ooka .................. H01L 27/0207 257/773 |
| 2012/0229438 A1* | 9/2012 | Fujita .................. G09G 3/3233 345/211 |
| 2013/0137213 A1* | 5/2013 | Egi .................. H01L 29/78693 438/104 |
| 2014/0103347 A1 | 4/2014 | Ishino |
| 2015/0103284 A1* | 4/2015 | Nagasawa ......... G02F 1/134336 349/46 |

FOREIGN PATENT DOCUMENTS

| | | |
|---|---|---|
| JP | 2001-312222 A | 11/2001 |
| JP | 2006-323333 A | 11/2006 |
| JP | 2007-241237 A | 9/2007 |
| JP | 2011-017755 A | 1/2011 |
| JP | 2014-078651 A | 5/2014 |

* cited by examiner

ACTIVE-MATRIX SUBSTRATE

TECHNICAL FIELD

The present invention relates to an active-matrix substrate.

BACKGROUND ART

There has been known an active-matrix substrate including a substrate provided thereon with a plurality of scanning lines (gate lines) extending in a first direction and a plurality of data lines (source lines) extending in a second direction different from the first direction, and transistors disposed correspondingly to intersection points of the scanning lines and the data lines (see Patent Literature 1).

CITATION LIST

Patent Literature

Patent Literature 1: JP 2011-017755 A

SUMMARY OF INVENTION

Technical Problem

Large line resistance of the scanning lines, the data lines, and the like leads to delay in signal transduction to terminal ends of the lines. The lines are thus preferred to have smaller resistivity.

It is an object of the present invention to provide a technique achieving decrease in line resistance of an active-matrix substrate.

Solution to Problem

According to an embodiment of the present invention, an active-matrix substrate includes: a substrate; a plurality of first lines disposed on the substrate and extending in a first direction; a plurality of second lines disposed on the substrate and extending in a second direction different from the first direction; a transistor disposed correspondingly to each of intersection points of the first lines and the second lines, and connected to a corresponding one of the first lines and a corresponding one of the second lines; an insulating layer; and an extended conductive film; in which at least ones of the first lines and the second lines each have a layered structure with connection to the extended conductive film via a contact hole provided in the insulating layer.

Effect of Invention

At least ones of the first lines and the second lines according to the present invention each have the layered structure with connection to the extended conductive film via the contact hole provided in the insulating layer, to achieve decrease in line resistance.

DESCRIPTION OF EMBODIMENTS

Figure 1:
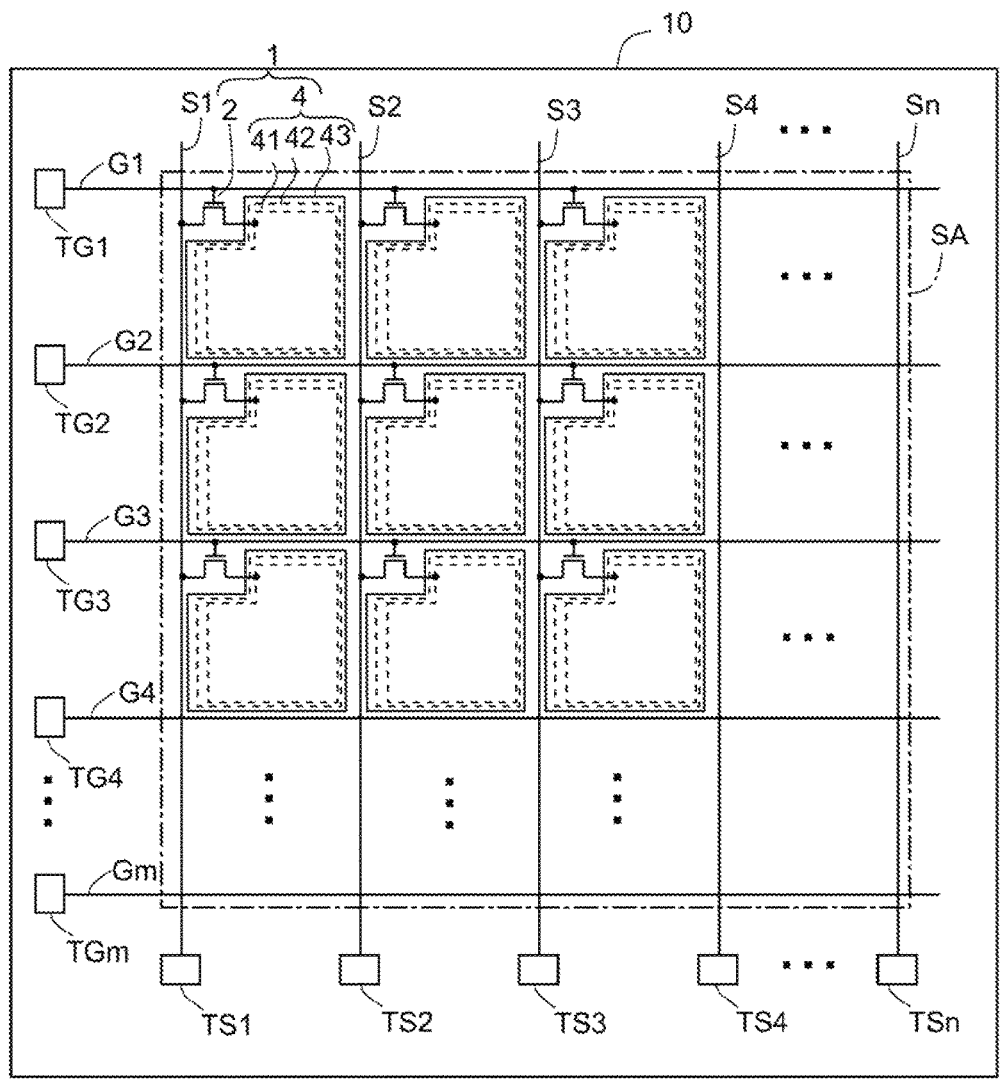
FIG. 1 is a plan view depicting an exemplary configuration of a photosensor substrate according to a first embodiment.

According to an embodiment of the present invention, an active-matrix substrate includes: a substrate; a plurality of first lines disposed on the substrate and extending in a first direction; a plurality of second lines disposed on the substrate and extending in a second direction different from the first direction; a transistor disposed correspondingly to each of intersection points of the first lines and the second lines, and connected to a corresponding one of the first lines and a corresponding one of the second lines; an insulating layer; and an extended conductive film; in which at least ones of the first lines and the second lines each have a layered structure with connection to the extended conductive film via a contact hole provided in the insulating layer (a first configuration).

At least ones of the first lines and the second lines in the first configuration each have connection to the extended conductive film via the contact hole provided in the insulating layer, to achieve decrease in line resistance. At least ones of the first lines and the second lines each have the layered structure with connection to the extended conductive film via the contact hole provided in the insulating layer, to achieve decrease in line resistance without significant increase in line area when viewed along a normal line of the substrate. Even in a case where the lines cannot be increased in thickness for some reason, the lines can be decreased in resistance in the layered structure with connection to the extended conductive film provided at a different layer level.

Optionally, in the first configuration, the extended conductive film includes a first-line extended conductive film and a second-line extended conductive film, the first lines are connected to the first-line extended conductive film, and the second lines are connected to the second-line extended conductive film (a second configuration).

The second configuration achieves decrease in line resistance of both the first lines and the second lines.

Optionally, in the second configuration, the first-line extended conductive film includes a first-line first extended conductive film connected to the first lines, and a first-line second extended conductive film disposed at a layer level different from the first-line first extended conductive film and connected to the first-line first extended conductive film (a third configuration).

The first lines in the third configuration each have a three-layer structure to achieve further decrease in resistance.

Optionally, in the third configuration, the first-line first extended conductive film is provided at a layer level identical to the second-line extended conductive film, and the first-line second extended conductive film is provided at a layer level identical to the second lines (a fourth configuration).

The fourth configuration achieves decrease in resistance of the first lines and the second lines in a three-layer structure including the layer provided with the first lines, the layer provided with the first-line first extended conductive film and the second-line extended conductive film, and the layer provided with the first-line second extended conductive film and the second lines.

Optionally, in the third or fourth configuration, the first-line first extended conductive film and the first lines are disposed at different layer levels and in parallel to each other (a fifth configuration).

The first-line first extended conductive film is disposed in parallel with the first lines in the fifth configuration, to achieve further decrease in resistance of the first lines in comparison to a configuration including the first-line first extended conductive film disposed between two adjacent ones of the second lines.

Optionally, in any one of the second to fourth configurations, the second-line extended conductive film and the second lines are disposed at different layer levels and in parallel to each other (a sixth configuration).

The second-line extended conductive film is disposed in parallel with the second lines in the sixth configuration, to achieve further decrease in resistance of the second lines in comparison to a configuration including the second-line extended conductive film disposed between two adjacent ones of the first lines.

Optionally, in any one of the second to fourth configurations, the first-line extended conductive film is disposed between two adjacent ones of the second lines, and the second-line extended conductive film is disposed between two adjacent ones of the first lines (a seventh configuration).

The first-line extended conductive film is disposed between two adjacent ones of the second lines in the seventh configuration, to facilitate formation of the first-line extended conductive film. Furthermore, the second-line extended conductive film is disposed between two adjacent ones of the first lines, to facilitate formation of the second-line extended conductive film.

Optionally, in the seventh configuration, the insulating layer includes a passivation film covering the transistor, and a flattening film facing the transistor with the passivation film interposed therebetween, and the passivation film and the flattening film are disposed between the first lines and the second lines in portions where the first lines and the second lines cross each other when viewed in a direction perpendicular to the substrate (an eighth configuration).

The passivation film and the flattening film in the eighth configuration secure a distance between the first lines and the second lines in the portions where the first lines and the second lines cross each other. This configuration achieves suppression in capacitance between the first lines and the second lines.

Optionally, in any one of the first to eighth configurations, the transistor includes a gate electrode, a gate insulating film, a semiconductor layer positioned to face the gate electrode with the gate insulating film interposed therebetween, and a drain electrode and a source electrode connected to the semiconductor layer and facing each other in a direction parallel to the substrate, and the gate electrode of the transistor is disposed between the gate insulating film and the substrate (a ninth configuration).

A bottom gate transistor includes a gate electrode disposed below a semiconductor layer. The gate electrode is thus restricted in terms of its material or thickness by a step of producing the semiconductor layer of the transistor. In a case where a line connected to the gate electrode is formed integrally with the gate electrode at an identical layer level, the line connected to the gate electrode is restricted in terms of its configuration such as the material or the thickness by the step of producing a semiconductor film of the transistor. However, the lines are connected to the extended conductive film disposed at a different layer level from the lines in the ninth configuration, to achieve decrease in line resistance also in the bottom gate transistor.

The active-matrix substrate further in any one of the first to ninth configurations optionally includes a photoelectric conversion element disposed correspondingly to each of the intersection points of the first lines and the second lines and connected to the transistor (a tenth configuration).

The tenth configuration achieves decrease in line resistance also in a photosensor substrate including the photoelectric conversion element.

EMBODIMENTS

Embodiments of the present invention will now be described in detail below with reference to the drawings. Identical or corresponding portions in the drawings will be denoted by identical reference signs and will not be described repeatedly. For clearer description, the drawings to be referred to hereinafter may depict simplified or schematic configurations or may not depict some of constructional elements. The constructional elements in each of the drawings may not necessarily be depicted in actual dimensional ratios.

First Embodiment

Exemplarily described below is a photosensor substrate including an active-matrix substrate and photoelectric conversion elements disposed on the active-matrix substrate.

The photosensor substrate is applicable to a photosensor, an X-ray image detection device, or the like.

FIG. 1 is a plan view depicting an exemplary configuration of a photosensor substrate according to the present embodiment. FIG. 1 depicts a photosensor substrate 10 provided with a plurality of gate lines G1, G2, . . . and Gm (hereinafter, collectively called gate lines G when not distinguished from one another) extending in a first direction (a transverse direction) and a plurality of source lines S1, S2, . . . and Sn (hereinafter, collectively called source lines S when not distinguished from one another) extending in a second direction (a longitudinal direction) and crossing the gate lines G.

The gate lines G and the source lines S have intersection points each correspondingly provided with a thin film transistor (TFT) 2 exemplifying a transistor. The TFTs 2 are each connected to a corresponding one of the gate lines G, a corresponding one of the source lines S, and a lower electrode 41. The lower electrode 41 is provided for a photodiode 4 exemplifying a photoelectric conversion element.

The lower electrode 41 is disposed in an area surrounded with two adjacent ones of the gate lines G and two adjacent ones of the source lines S. There are provided a semiconductor film 42 and an upper electrode 43 each overlapped with the lower electrode 41. The lower electrode 41, the semiconductor film 42, and the upper electrode 43 being stacked configure the photodiode 4. The lower electrode 41, the semiconductor film 42, and the upper electrode 43 are overlapped in the mentioned order in a direction perpendicular to a plane of the photosensor substrate 10.

Each of the TFTs 2 and corresponding one of the photodiodes 4 configure a single sensor unit 1. The sensor units 1 are arrayed in a matrix form on the plane of the photosensor substrate 10. The sensor units 1 are disposed in each of the areas surrounded with the two adjacent gate lines G and the two adjacent source lines S. Each of the sensor units 1 corresponds to a single pixel.

The photodiode 4 in each of the sensor units 1 converts light applied to the semiconductor film 42 to electric charges (electron holes). Specifically, light applied to the semiconductor film 42, which receives voltage and is in a reverse bias state, is converted to electric charges excited in a depletion layer. The converted electric charges are extracted to the outside via the source line S when a signal supplied from the gate line G brings the TFT 2 into an ON state. This causes output of an electric signal according to an amount of received light. The photosensor substrate 10 converts an amount of light applied to each of the sensor units 1 to a current amount to be outputted as an electric signal or an image. This enables acquisition of an image having pixels respectively corresponding to the sensor units 1.

The gate lines G and the source lines S are led out of a sensor area SA. The sensor area SA in the photosensor substrate 10 is provided with the sensor units 1 when viewed in a direction perpendicular to the substrate (along a normal line of the substrate), where light is detected. Outside the sensor area SA, the gate lines G1 to Gm are connected to terminal parts TG1 to TGm, respectively, (hereinafter, collectively called terminal parts TG when not distinguished from one another), whereas the source lines S1 to Sn are connected to terminal parts TS1 to TSn, respectively (hereinafter, collectively called terminal parts TS when not distinguished from one another).

The terminal part TG of each of the gate lines G can be connected with a circuit configured to output a drive signal to be supplied to the gate line G. The terminal part TS of each of the source lines S can be connected with a circuit configured to process a signal outputted from the source line S (e.g. an amplifier configured to amplify a signal, or an A/D converter configured to perform A/D conversion of a signal (conversion between an analog signal and a digital signal)).

Figure 2:
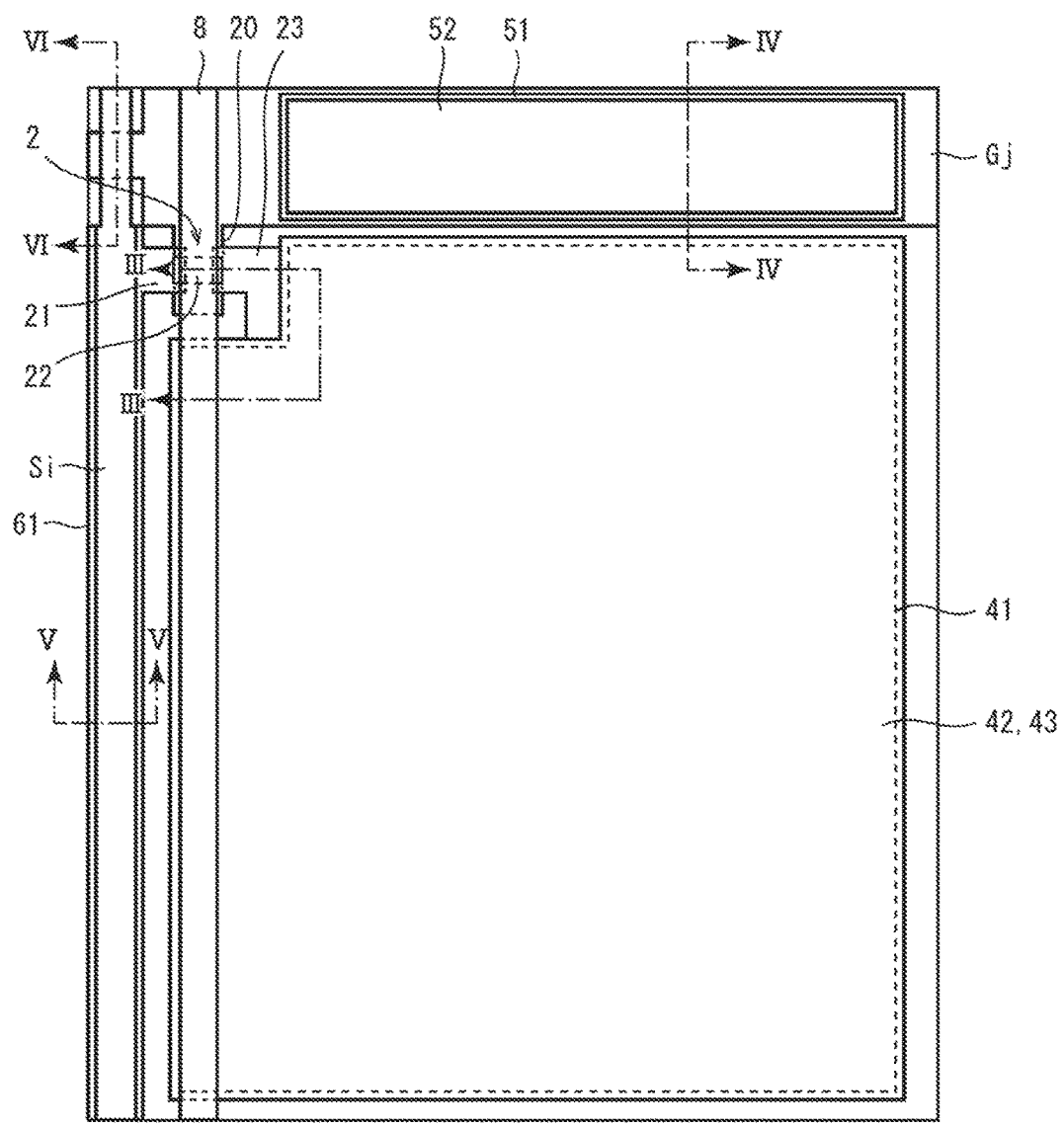
FIG. 2 is a view in a direction perpendicular to the photosensor substrate, depicting an exemplary configuration of a sensor unit.
Figure 3:
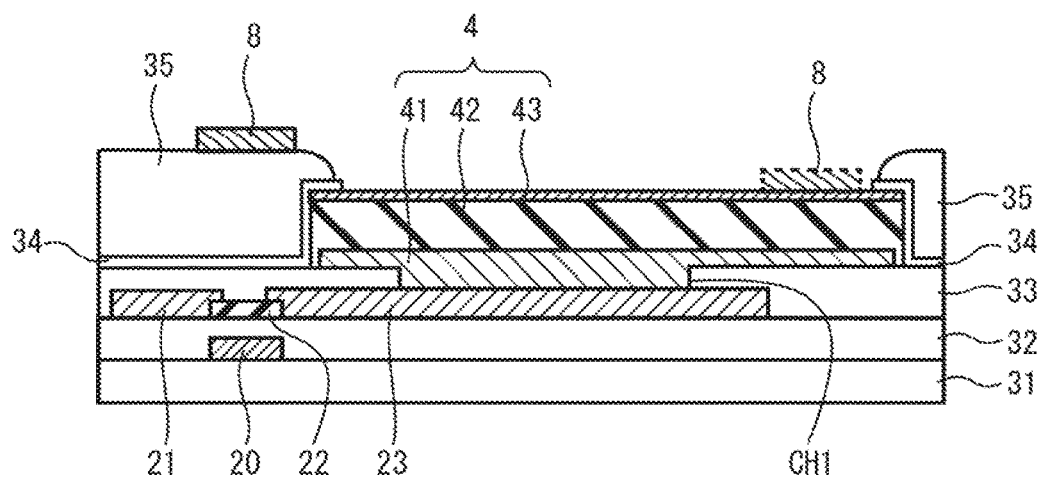
FIG. 3 is a sectional view taken along line Ill-Ill indicated in FIG. 2.
Figure 4:
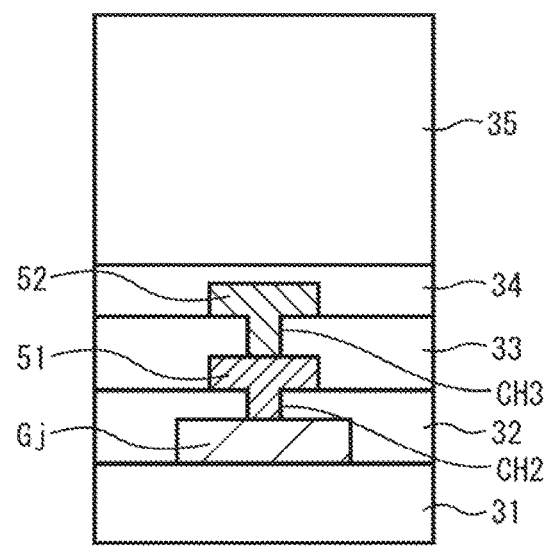
FIG. 4 is a sectional view taken along line IV-IV indicated in FIG. 2.
Figure 5:
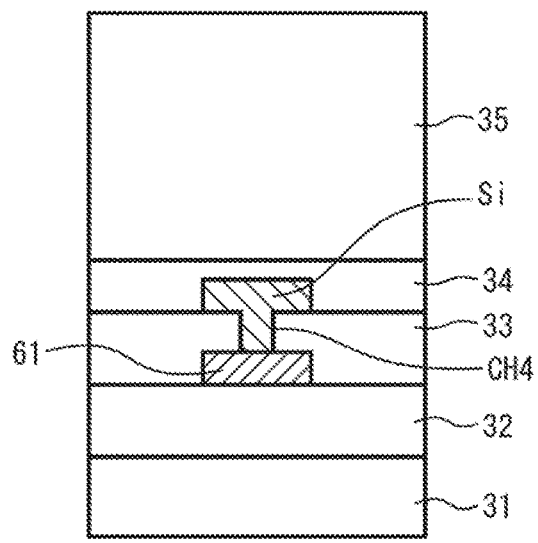
FIG. 5 is a sectional view taken along line V-V indicated in FIG. 2.
Figure 6:
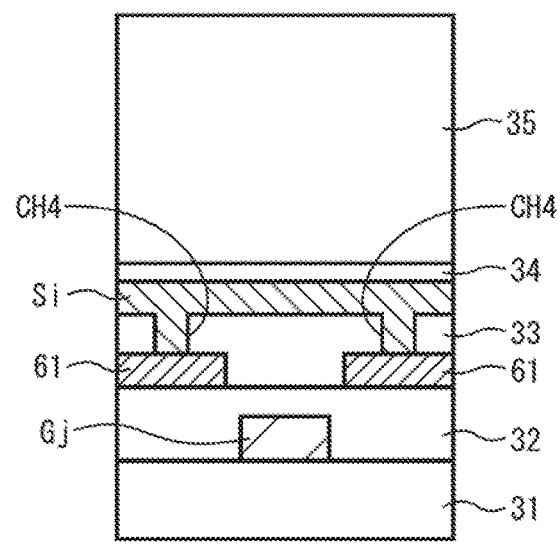
FIG. 6 is a sectional view taken along line VI-VI indicated in FIG. 2.

FIG. 2 is a view in a direction perpendicular to the photosensor substrate 10, depicting an exemplary configuration of the sensor unit 1. FIG. 2 depicts the configuration of the sensor unit 1 disposed correspondingly to the intersection point of an i-th source line Si and a j-th gate line Gj. FIG. 3 is a sectional view taken along line III-III indicated in FIG. 2. FIG. 4 is a sectional view taken along line IV-IV indicated in FIG. 2. FIG. 5 is a sectional view taken along line V-V indicated in FIG. 2. FIG. 6 is a sectional view taken along line VI-VI indicated in FIG. 2.

The TFT 2 is positioned correspondingly to the intersection point of the source line Si and the gate line Gj. The TFT 2 includes a gate electrode 20, a source electrode 21, a semiconductor layer 22, and a drain electrode 23. The drain electrode 23 is connected to the lower electrode 41 of the photodiode 4.

The source electrode 21, the semiconductor layer 22, and the drain electrode 23 are disposed at an identical layer level. The source electrode 21 and the drain electrode 23 face each other in a direction parallel to the substrate. The semiconductor layer 22 has an area between the source electrode 21 and the drain electrode 23. The gate electrode 20 is positioned to be overlapped with the semiconductor layer 22 when viewed along the normal line of the substrate.

The lower electrode 41 of the photodiode 4 is provided in an area surrounded with the source line Si, a source line Si+1 (not depicted) adjacent thereto, the gate line Gj, and a gate line Gj+1 (not depicted) adjacent thereto. The semiconductor film 42 and the upper electrode 43 of the photodiode 4 are provided to be overlapped with the lower electrode 41 in this area.

There is provided a bias line 8 positioned to be overlapped with the upper electrode 43 of the photodiode 4. The bias line 8 is electrically connected with the upper electrode 43. The bias line 8 extends along the source line Si to outside the sensor area SA, and is electrically connected also to the upper electrodes 43 of the other sensor units 1 aligned along the bias line. The bias line 8 is configured to apply reverse bias voltage to the semiconductor film 42.

As depicted in FIG. 3, the gate electrode 20 is disposed on a substrate 31. As depicted in FIG. 4, the gate line Gj is disposed on the substrate 31. There is provided a gate insulating film 32 serving as an insulating layer covering the substrate 31, the gate electrode 20, and the gate line Gj.

As depicted in FIG. 3, the source electrode 21 and the drain electrode 23 of the TFT 2 are disposed on the gate insulating film 32 and face each other. The semiconductor layer 22 is provided on the gate insulating film 32 and extends at least from an end of the source electrode 21 to an end of the drain electrode 23 facing the end of the source electrode 21. FIG. 3 exemplarily depicts a case where the end of the source electrode 21 is provided over a first end of the semiconductor layer 22 and the end of the drain electrode 23 is provided over a second end of the semiconductor layer 22. The semiconductor layer 22 is positioned to be overlapped with the gate electrode 20 when viewed along the normal line of the substrate 31.

The semiconductor layer 22 can be made of an oxide semiconductor or a silicon semiconductor. The oxide semiconductor can include an In—Ga—Zn—O-based semiconductor mainly containing indium, gallium, zinc, and oxygen. The In—Ga—Zn—O-based semiconductor can include a portion made of a crystalline substance. The oxide semiconductor will specifically be exemplified later.

There is provided a first passivation film 33 serving as an insulating layer covering the source electrode 21, the semiconductor layer 22, and the drain electrode 23.

The source line Si according to the present embodiment is provided at a different layer level from the source electrode 21. Specifically, the source electrode 21 is provided on the gate insulating film 32 as described above, whereas the source line Si is provided on the first passivation film 33 as depicted in FIG. 5.

The first passivation film 33 is provided thereon with the lower electrode 41, the semiconductor film 42, and the upper electrode 43 of the photodiode 4 stacked in the mentioned order. The lower electrode 41 is provided at a different layer level from the source electrode 21, the semiconductor layer 22, and the drain electrode 23, with the first passivation film 33 interposed therebetween. The lower electrode 41 partially faces the drain electrode 23 with the first passivation film 33 interposed therebetween.

The first passivation film 33 has a contact hole CH1 electrically connecting the lower electrode 41 and the drain electrode 23. In other words, the lower electrode 41 is electrically connected to the drain electrode 23 via the contact hole CH1.

The contact hole CH1 is smaller in area than the lower electrode 41 when viewed along the normal line of the substrate 31. The contact hole CH1 can alternatively have an area substantially equal to or larger than the area of the lower electrode 41 when viewed along the normal line of the substrate 31. In the latter case, the lower electrode 41 can be provided at an identical layer level with the source electrode 21, the semiconductor layer 22, and the drain electrode 23. The lower electrode 41 can be provided as a conductor formed integrally with the drain electrode 23 in this configuration.

The lower electrode 41 is provided thereon with the semiconductor film 42 in contact with the lower electrode 41. The upper electrode 43 is provided on the semiconductor film 42. The upper electrode 43 thus faces the lower electrode 41 with the semiconductor film 42 interposed therebetween. The bias line 8 is provided on the upper electrode 43.

The semiconductor film 42 can include an n-type (n+) semiconductor layer, an i-type semiconductor layer, and a p-type (p+) semiconductor layer stacked in the mentioned order. These semiconductor layers can be made of amorphous silicon or the like. The upper electrode 43 can be a transparent electrode made of ITO, IZO, ZnO, SnO, or the like.

There is provided a second passivation film 34 serving as an insulating layer covering the first passivation film 33 and part of the photodiode 4. The second passivation film 34 is provided thereon with a flattening film 35 serving as an insulating layer.

The gate line Gj according to the present embodiment has a three-layer structure in the portion between the two adjacent source lines S as depicted in FIG. 4. Specifically, the gate line Gj is covered with the gate insulating film 32 that is provided thereon with a first extended conductive film 51. The first extended conductive film 51 is covered with the first passivation film 33 that is provided thereon with a second extended conductive film 52.

The gate insulating film 32 has a contact hole CH2. The first extended conductive film 51 is connected to the gate line Gj via the contact hole CH2. When viewed along the normal line of the substrate 31, the contact hole CH2 is smaller in area than the first extended conductive film 51, but can alternatively have an area substantially equal to or larger than the area of the first extended conductive film 51.

The first passivation film 33 has a contact hole CH3. The second extended conductive film 52 is connected to the first extended conductive film 51 via the contact hole CH3. When viewed along the normal line of the substrate 31, the contact hole CH3 is smaller in area than the second extended conductive film 52, but can alternatively have an area substantially equal to or larger than the area of the second extended conductive film 52.

As depicted in FIG. 2, the first extended conductive film 51 and the second extended conductive film 52 are provided between the two adjacent source lines S. The first extended conductive film 51 and the second extended conductive film 52 can be made equal in width in the second direction (the longitudinal direction) to the gate line Gj. The first extended conductive film 51 and the second extended conductive film 52 can alternatively be made smaller or larger in width than the gate line Gj in the second direction (the longitudinal direction). As depicted in FIG. 2, the first extended conductive film 51 and the second extended conductive film 52 are not electrically connected to any electric member other than the gate line Gj.

The gate line Gj is at least partially provided thereon with the first extended conductive film 51 and the second extended conductive film 52 to have a layered structure. This configuration achieves decrease in resistance of the gate line Gj with no increase in line area when viewed along the normal line of the substrate 31.

The gate line Gj, the first extended conductive film 51, and the second extended conductive film 52 are not limited to those depicted in FIG. 4 in terms of their locations and stacked orders. The first extended conductive film 51 and the second extended conductive film 52 can be disposed below the gate line Gj, or can interpose the gate line Gj therebetween.

The source line Si according to the present embodiment has a two-layer structure in the portion between the two adjacent data lines G as depicted in FIG. 5. Specifically, the gate insulating film 32 is provided thereon with an extended conductive film 61. The extended conductive film 61 is covered with the first passivation film 33 that is provided thereon with the source line Si.

The first passivation film 33 has a contact hole CH4. The source line Si is connected to the extended conductive film 61 via the contact hole CH4. When viewed along the normal line of the substrate 31, the contact hole CH4 is smaller in area than the source line Si, but can alternatively have an area substantially equal to or larger than the area of the source line Si.

As depicted in FIG. 2, the extended conductive film 61 is provided between the two adjacent gate lines G. The extended conductive film 61 can be made equal in width in the first direction (the transverse direction) to the source line Si. The extended conductive film 61 can alternatively be made smaller or larger in width than the source line Si in the first direction (the transverse direction). As depicted in FIG. 2, the extended conductive film 61 is not electrically connected to any electric member other than the source line Si.

The source line Si is at least partially provided therebelow with the extended conductive film 61 to have a layered structure. This configuration achieves decrease in resistance of the source line Si with no increase in line area when viewed along the normal line of the substrate 31.

The source line Si and the extended conductive film 61 are not limited to those depicted in FIG. 5 in terms of their locations and stacked orders. The source line Si can alternatively be provided thereon with the extended conductive film 61.

FIG. 6 is a sectional view of a portion where the gate line Gj and the source line Si cross each other. As described above, the gate line Gj is provided on the substrate 31, the extended conductive film 61 is provided on the gate insulating film 32, and the source line Si is provided on the first passivation film 33. The extended conductive film 61 is provided above the gate line Gj. The extended conductive film 61 is, however, not provided above the gate line Gj in the portion where the gate line Gj and the source line Si cross each other, as depicted in FIG. 6. The gate insulating film 32 and the first passivation film 33 thus secure a distance between the gate line Gj and the source line Si in the portion where the gate line Gj and the source line Si cross each other, to achieve suppression in capacitance between the gate line Gj and the source line Si.

As depicted in FIG. 2, the gate line Gj is smaller in width in the portion where the gate line Gj and the source line Si cross each other than the remaining portion. The source line Si is similarly smaller in width in the portion where the gate line Gj and the source line Si cross each other than the remaining portion. This configuration achieves suppression in capacitance between the gate line Gj and the source line Si in the portion where the gate line Gj and the source line Si cross each other, in comparison to a case where the gate line Gj and the source line Si are not decreased in width.

FIGS. 7A to 8D are views depicting exemplary steps of producing the photosensor substrate according to the present embodiment. FIG. 7A to FIG. 8D each include a sectional view of a portion provided with the gate line G, a sectional view of a portion where the gate line G and the source line S cross each other, a sectional view of a portion provided with the source line 5, and a sectional view of a portion provided with the TFT 2 and the photodiode 4, aligned from the left in the mentioned order.

Substrate

Examples of the substrate 31 include a glass substrate, a silicon substrate, a heat-resistant plastic substrate, and a heat-resistant resin substrate. The plastic substrate or the resin substrate can be made of polyethylene terephthalate (PET), polyethylene naphthalate (PEN), polyether sulfone (PES), acryl, polyimide, or the like.

Formation of Gate Line and Gate Electrode

Figure 7A:
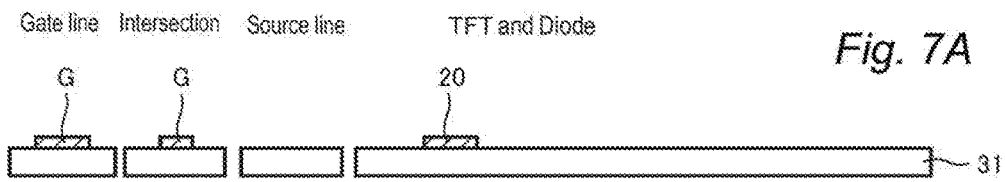
FIGS. 7A to 7F are views depicting exemplary steps of producing the photosensor substrate according to the first embodiment.

The gate line G and the gate electrode 20 are formed on the substrate 31 (see FIG. 7A). The substrate 31 is provided thereon with a conductive film of 100 nm to 500 nm thick or the like to form the gate line G and the gate electrode 20. The conductive film can be made of a material appropriately selected from among metals such as aluminum (Al), tungsten (W), molybdenum (Mo), tantalum (Ta), chromium (Cr), titanium (Ti), and copper (Cu), alloys thereof, and metal nitrides thereof. The conductive film can optionally include a plurality of layers made of these materials.

In an exemplary case, W of 370 nm thick and TaN of 50 nm thick are deposited with use of a sputtering device and are then processed to have a desired pattern in accordance with the photolithography method and by dry etching, to obtain the gate line G and the gate electrode 20.

Formation of Gate Insulating Film

Figure 7B:
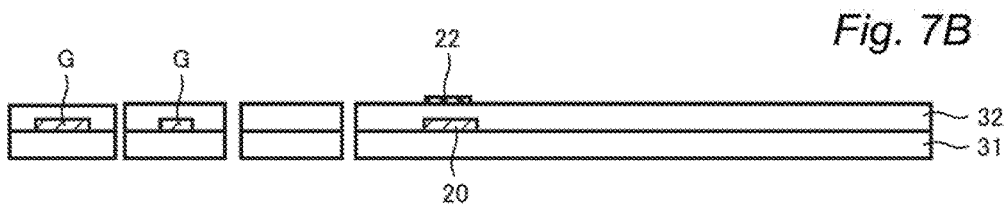

The gate insulating film 32 is subsequently formed to cover the substrate 31, the gate line G, and the gate electrode 20 (see FIG. 7B). The gate insulating film 32 is formed to have a two-layer structure in this case. The gate insulating film 32 can be made of a material appropriately selected from among a silicon oxide (SiOx), a silicon nitride (SiNx), a silicon oxidized nitride (SiOxNy) (x>y), a silicon nitrided oxide (SiNxOy) (x>y), and the like. In order to prevent diffusion of impurities and the like from the substrate 31, preferably, the lower layer in the gate insulating film 32 is made of a silicon nitride (SiNx), a silicon nitrided oxide (SiNxOy) (x>y), or the like, whereas the upper layer in the gate insulating film 32 is made of a silicon oxide (SiOx), a silicon oxidized nitride (SiOxNy) (x>y), or the like. A rare-gas element like argon contained in reactant gas can be mixed into the insulating film. The insulating film thus obtained achieves denseness with low film forming temperature and small gate leakage current.

In an exemplary case, the gate insulating film 32 is formed by continuously depositing SiN of 325 nm thick and $SiO_2$ of 10 nm thick with use of CVD equipment.

Formation of Semiconductor Layer

The semiconductor layer 22 is subsequently formed on the gate insulating film 32 (see FIG. 7B). The semiconductor layer 22 contains, for example, a semiconductor of an In—Ga—Zn—O type (hereinafter, simply referred to as "In—Ga—Zn—O-based semiconductor"). The In—Ga—Zn—O-based semiconductor is ternary oxide including indium (In), gallium (Ga), and zinc (Zn), in which the ratio (composition ratio) of In, Ga, and Zn is not limited particularly and may be, for example, In:Ga:Zn=2:2:1, In:Ga:Zn=1:1:1, In:Ga:Zn=1:1:2 or the like. The semiconductor layer 22 may contain, for example, $InGaO_3(ZnO)_5$.

A TFT including an In—Ga—Zn—O-based semiconductor layer has high mobility (more than 20 times of that of an amorphous silicon (a-Si) TFT) and lower leakage current (one hundredth of the leakage current in the case of a-Si TFT, or less than that). Such a TFT is preferably applicable as a drive TFT or a pixel TFT. The TFT including the In—Ga—Zn—O-based semiconductor layer has such high mobility and thus enables reduction in size of the TFT. Application of the TFT including the In—Ga—Zn—O-based semiconductor layer enables significant reduction in electric power consumption of a device and/or improvement in resolution of the device.

The In—Ga—Zn—O-based semiconductor can be amorphous (noncrystalline) or include a portion made of a crystalline substance. Such an In—Ga—Zn—O-based semiconductor containing a crystalline substance preferably has a c-axis oriented substantially perpendicular to the layer surface. The crystalline structure of such an In—Ga—Zn—O-based semiconductor is disclosed in, for example, JP 2012-134475-A. The entire contents disclosed in JP 2012-134475 A are herein incorporated by reference.

The semiconductor layer 22 may contain any other oxide semiconductor in place of the In—Ga—Zn—O-based semiconductor. The semiconductor layer 22 may contain a Zn—O-based semiconductor (ZnO), an In—Zn—O-based semiconductor (IZO (registered trademark)), a Zn—Ti—O-based semiconductor (ZTO), a Cd—Ge—O-based semiconductor, a Cd—Pb—O-based semiconductor, cadmium oxide (CdO), an Mg—Zn—O-based semiconductor, an In—Sn—Zn—O-based semiconductor (e.g. $In_2O_3$—$SnO_2$—ZnO), an In—Ga—Sn—O-based semiconductor, or the like.

The Zn—O-based semiconductor may be a semiconductor containing ZnO with no additive of any impurity element, or ZnO with an additive of an impurity. The Zn—O- based semiconductor may be a semiconductor containing an additive of one or a plurality of impurity elements in Groups I, XIII, XIV, XV, and XVII. The Zn—O-based semiconductor can contain a magnesium zinc oxide ($Mg_xZn_{1-x}O$), a cadmium zinc oxide ($Cd_xZn_{1-x}O$), or the like. The Zn—O-based semiconductor can be in an amorphous (noncrystalline) state, in a polycrystalline state, or in a microcrystalline state mixedly including the noncrystalline state and the polycrystalline state.

The semiconductor layer 22 can include any other semiconductor in place of the oxide semiconductor. The semiconductor layer 22 can contain amorphous silicon, polycrystal silicon, low-temperature polysilicon, or the like.

The semiconductor layer 22 is typically 30 nm to 100 nm thick. In an exemplary case, the semiconductor layer 22 is obtained by forming a semiconductor film in accordance with the sputtering method and then processing the semiconductor film to have a predetermined shape (pattern) through photolithography processing including etching with use of a resist mask.

Formation of Contact Hole CH2

Figure 7C:
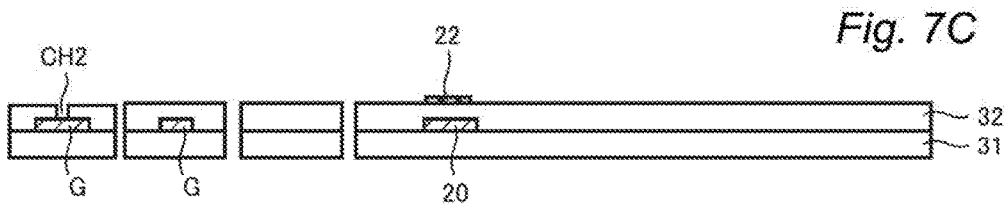

The contact hole CH2 is subsequently formed in the gate insulating film 32 through photolithography processing including etching with use of a resist mask, to connect the gate line G and the first extended conductive film 51 formed in a step to be described later (see FIG. 7C).

Formation of Source Electrode/Drain Electrode and Extended Conductive Film

Figure 7D:
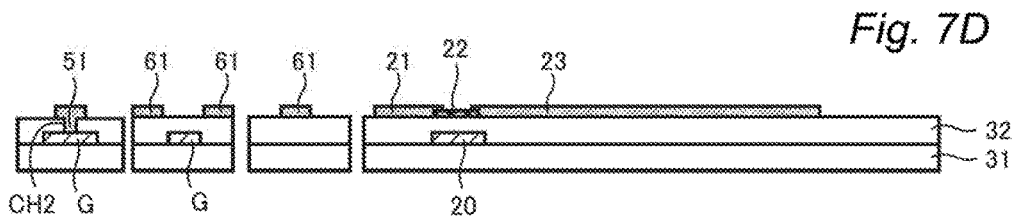

The gate insulating film 32 and the semiconductor layer 22 are subsequently provided thereon with a conductive film that is processed to have a predetermined shape (pattern) through photolithography processing including etching with use of a resist mask, so as to obtain the source electrode 21, the drain electrode 23, the first extended conductive film 51, and the extended conductive film 61 (see FIG. 7D). The first extended conductive film 51 is formed to be connected to the gate line G via the contact hole CH2. The conductive film can be made of a material appropriately selected from among metals such as aluminum (Al), tungsten (ON), molybdenum (Mo), tantalum (Ta), copper (Cu), chromium (Cr), and titanium (Ti), alloys thereof, and metal nitrides thereof. The conductive film can optionally include a plurality of layers made of these materials.

In an exemplary case, a film made of Ti of 100 nm thick, a film made of Al of 300 nm thick, and a film made of Ti of 30 nm thick are formed in the mentioned order in accordance with the sputtering method and are then processed to have a desired pattern in accordance with the photolithography method and by dry etching. The TFT 2 is thus obtained.

Formation of First Passivation Film

Figure 7E:
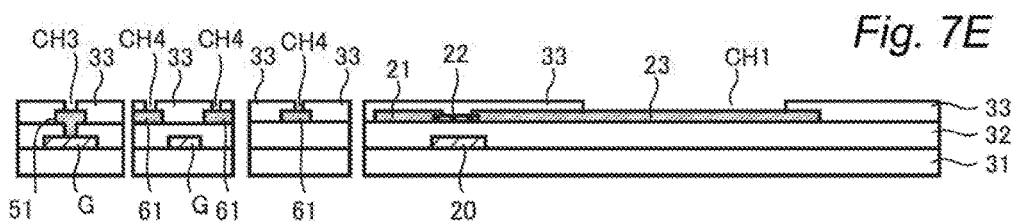

The first passivation film 33 is formed to cover the source electrode 21, the semiconductor layer 22, the drain electrode 23, the first extended conductive film 51, and the extended conductive film 61 (see FIG. 7E). The first passivation film 33 is typically 200 nm to 600 nm thick. The first passivation film 33 can be made of an insulating material such as a silicon nitride, a silicon oxide, a silicon nitrided oxide, or a silicon oxidized nitride, and can be formed in accordance with a thin film forming method such as the plasma CVD method or the sputtering method. The first passivation film 33 is not limited to a single layer structure but can have two or more layers. Furthermore, the entire substrate is optionally heat treated.

The contact holes CH1, CH3, and CH4 are then formed in the first passivation film 33 through photolithography processing including etching with use of a resist mask (see FIG. 7E). The contact hole CH1 connects the drain electrode 23 and the lower electrode 41 formed in a step to be described later. The contact hole CH3 connects the first extended conductive film 51 and the second extended conductive film 52 formed in a step to be described later. The contact hole CH4 connects the extended conductive film 61 and the source line S formed in a step to be described later.

Formation of Lower Electrode and Extended Conductive Film

Figure 7F:
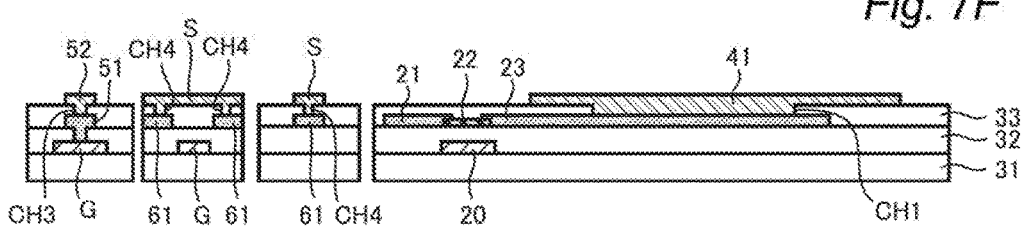

The first passivation film 33 is subsequently provided thereon with a conductive film that is processed to have a predetermined shape (pattern) through photolithography processing including etching with use of a resist mask, so as to obtain the lower electrode 41, the second extended conductive film 52, and the source line S (see FIG. 7F). The conductive film can be made of a material appropriately selected from among metals such as aluminum (Al), tungsten (W), molybdenum (Mo), tantalum (Ta), copper (Cu), chromium (Cr), and titanium (Ti), alloys thereof, and metal nitrides thereof. The conductive film can optionally include a plurality of layers made of these materials.

The lower electrode 41 is formed to be connected to the drain electrode 23 via the contact hole CH1. The second extended conductive film 52 is formed to be connected to the first extended conductive film 51 via the contact hole CH3. The source line S is formed to be connected to the extended conductive film 61 via the contact hole CH4.

In an exemplary case, a film made of Ti of 100 nm thick, a film made of Al of 300 nm thick, and a film made of Ti of 30 nm thick are formed in accordance with the sputtering method and are then processed to have a desired pattern in accordance with the photolithography method and by dry etching.

Formation of Semiconductor Film and Upper Electrode of Photodiode

The entire substrate 31 is provided thereon with an n-type semiconductor layer, an i-type semiconductor layer, and a p-type semiconductor layer in the mentioned order in accordance with the CVD method or the like, to cover the first passivation film 33 and the lower electrode 41. These semiconductor layers configure the semiconductor film 42. A film made of a transparent conductive material such as IZO or ITO is subsequently formed in accordance with the sputtering method, in an area including the area provided with the semiconductor film 42. The transparent conductive material serves as a conductor for the upper electrode 43. The film is then processed to have a predetermined shape (pattern) through photolithography processing and dry etching to obtain the semiconductor film 42 and the upper electrode 43 (see FIG. 8A). The photodiode 4 thus obtained includes the lower electrode 41, the semiconductor film 42, and the upper electrode 43 being stacked.

The n-type semiconductor layer in the semiconductor film 42 is made of noncrystalline silicon (amorphous silicon: a-Si) or the like and configures an nT area. The n-type semiconductor layer is typically about 40 nm to 50 nm thick. The i-type semiconductor layer can be a non-doped intrinsic semiconductor layer or the like with less conductivity than the n-type semiconductor layer and the p-type semiconductor layer, and is made of noncrystalline silicon (a-Si) or the like. The i-type semiconductor layer is typically about 500 nm to 1500 nm thick, and achieves higher optical sensitivity with larger thickness. The p-type semiconductor layer is made of noncrystalline silicon (a-Si) or the like, and configures a p+ area. The p-type semiconductor layer is typically about 10 nm to 50 nm thick. The p-type semiconductor layer can alternatively be formed by implanting boron (B) on the i-type semiconductor layer in accordance with the ion shower doping method or the ion implantation method.

Formation of Second Passivation Film

Figure 8A:
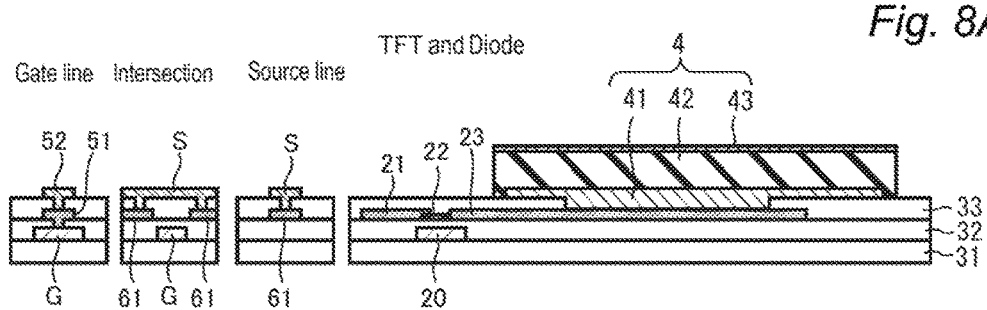
FIGS. 8A to 8D are views depicting exemplary steps, subsequent to the production steps depicted in FIGS. 7(a) to 7(f), of producing the photosensor substrate according to the first embodiment.
Figure 8B:
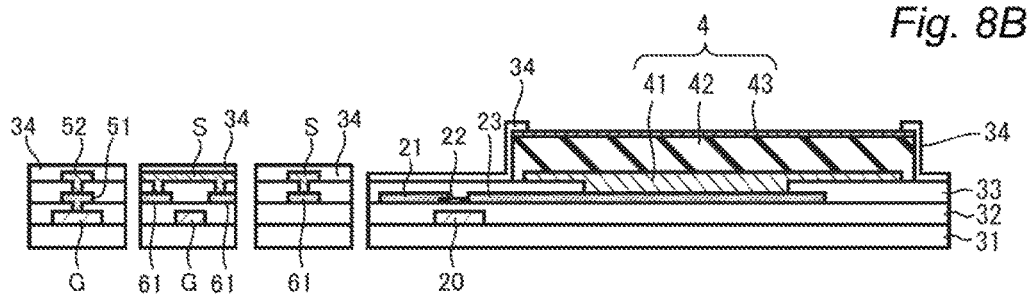
Figure 8C:
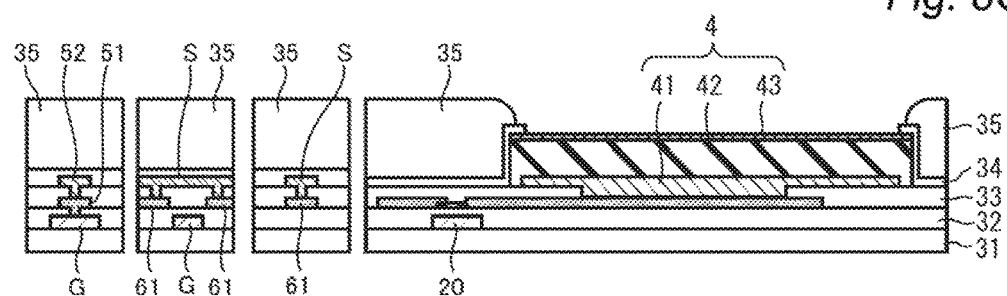

The second passivation film 34 is subsequently formed to cover the TFT 2 as well as side surfaces and ends of an upper surface of the photodiode 4 (see FIG. 8B). The second passivation film 34 can be made similarly to the first passivation film 33 in terms of its material and formation method. The second passivation film 34 is typically 100 nm to 200 nm thick.

Formation of Flattening Film

The entire second passivation film 34 is then provided thereon with a flattening film. The flattening film can be made of photosensitive resin or the like. This enables processing to have a desired pattern with no use of any photoresist, to obtain the flattening film 35 having an opening disposed correspondingly to the area provided with the photodiode 4 (see FIG. 8C). The flattening film 35 is typically 2 μm to 3 μm thick.

Formation of Bias Line

Figure 8D:
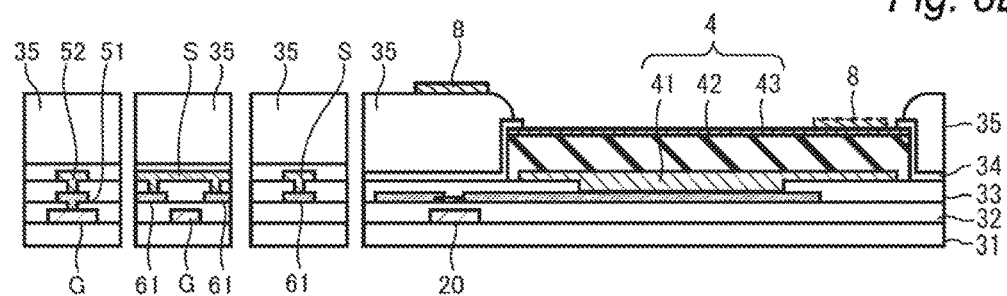

The flattening film 35 is subsequently provided in the opening thereof with a conductive film that is processed to have a predetermined shape (pattern) through photolithography processing including etching with use of a resist mask, so as to obtain the bias line 8 (see FIG. 8D). The conductive film can be made of a metal such as aluminum (Al), molybdenum (Mo), or titanium (Ti). The bias line 8 can exemplarily include a film made of Ti of 50 nm thick, a film made of Al of 300 nm thick, and a film made of Ti of 33 nm thick.

The entire substrate is then preferably provided with a protective film (not depicted) protecting the photosensor substrate 10.

Modification Example 1

Figure 9:
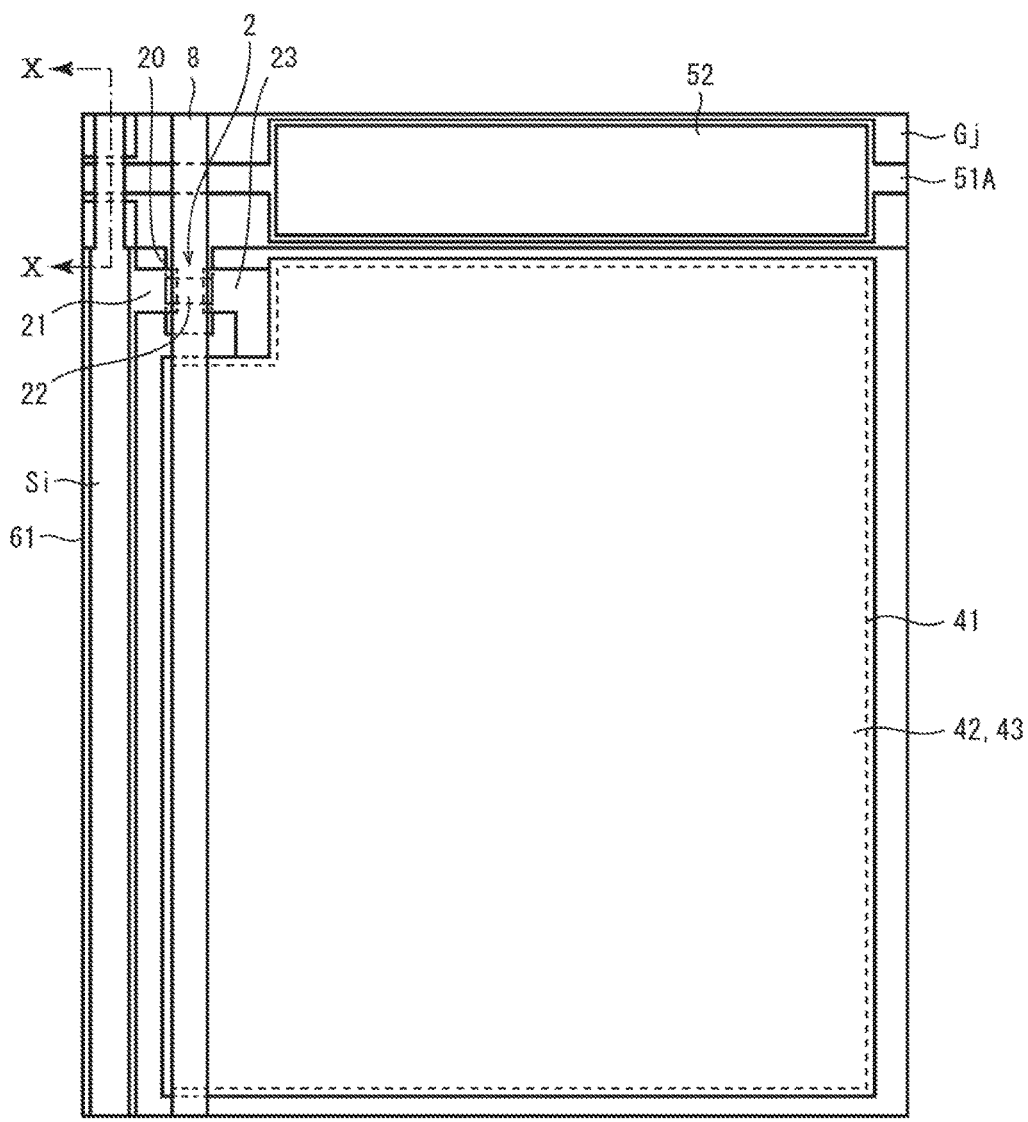
FIG. 9 is a view in a direction perpendicular to the photosensor substrate, depicting an exemplary configuration of a sensor unit according to a modification example 1.
Figure 10:
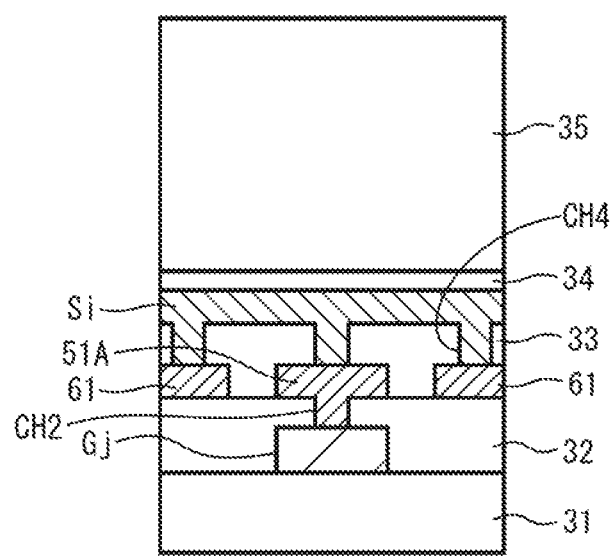
FIG. 10 is a sectional view taken along line X-X indicated in FIG. 9.

FIG. 9 is a view in a direction perpendicular to the photosensor substrate 10, depicting an exemplary configuration of the sensor unit 1 according to the modification example 1. FIG. 10 is a sectional view taken along line X-X indicated in FIG. 9.

The modification example 1 is different from the first embodiment in the shape of a first extended conductive film 51A. The first extended conductive film 51 according to the first embodiment is provided only between the adjacent source lines S, whereas the first extended conductive film 51A according to the modification example 1 extends in the first direction (the transverse direction) similarly to the gate line G.

FIG. 9 exemplarily depicts the first extended conductive film 51A decreased in width in the portion where the gate line Gj and the source line Si cross each other than the remaining portion. This configuration achieves suppression in capacitance between the gate line Gj connected to the first extended conductive film 51A and the source line Si in the portion where the gate line Gj and the source line Si cross each other, in comparison to a case where the first extended conductive film 51A is not decreased in width.

According to the modification example 1, the first extended conductive film 51A and the gate line G are provided at different levels and in parallel with each other. The gate line G thus has the layered structure not partially but entirely, to achieve further decrease in resistance of the gate line G.

Modification Example 2

Figure 11:
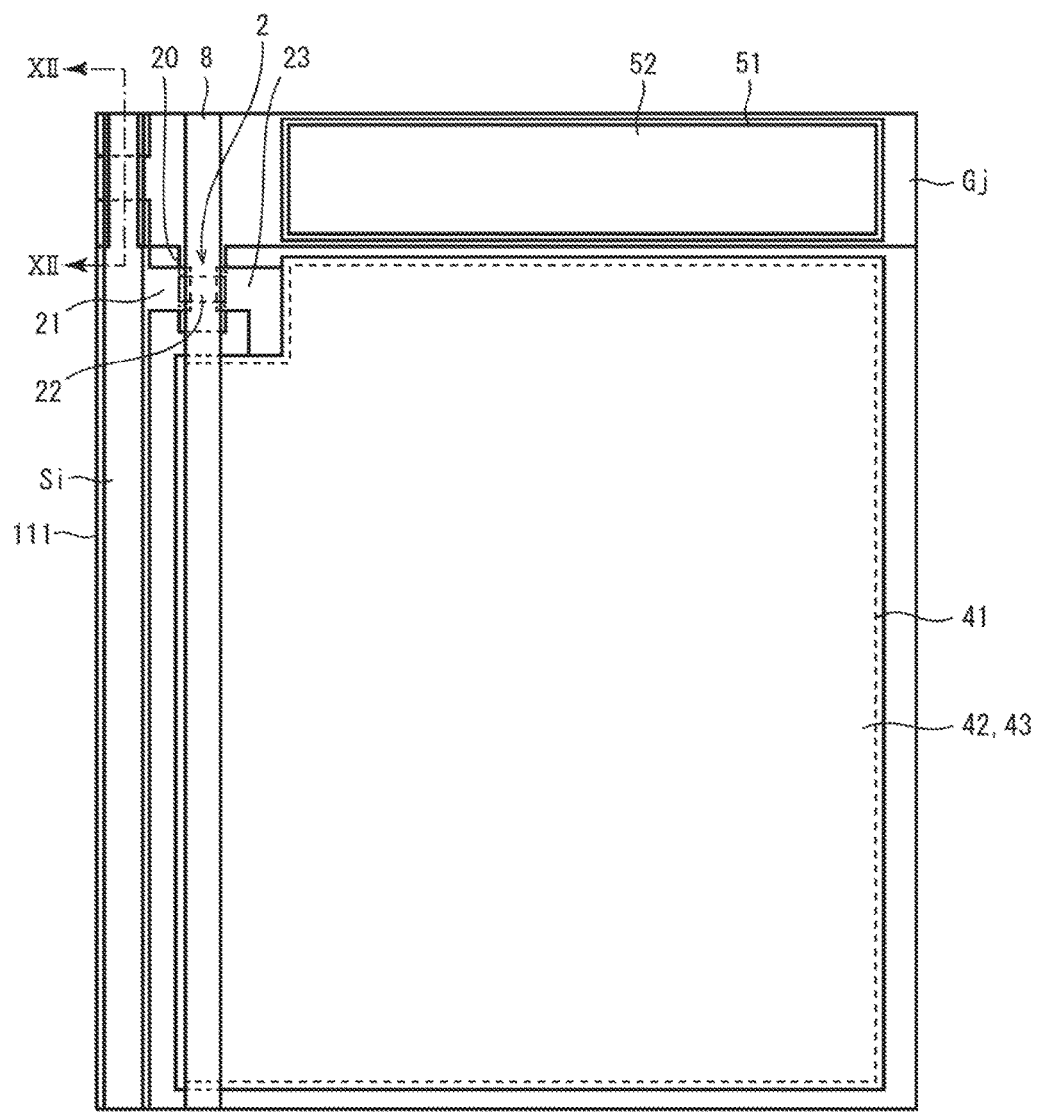
FIG. 11 is a view in a direction perpendicular to the photosensor substrate, depicting an exemplary configuration of a sensor unit according to a modification example 2.
Figure 12:
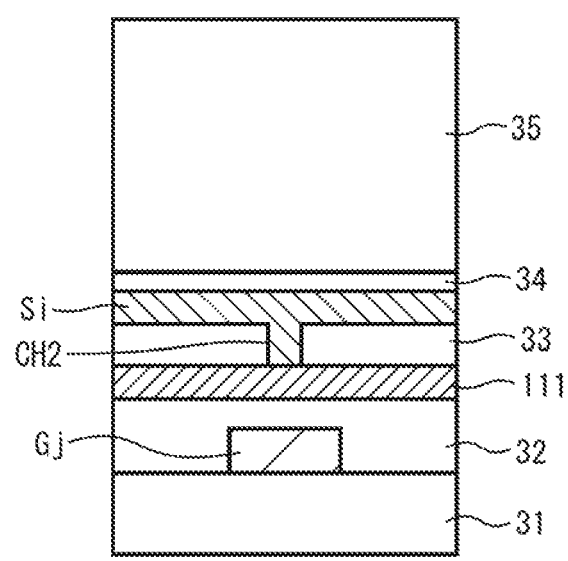
FIG. 12 is a sectional view taken along line XII-XII indicated in FIG. 11.

FIG. 11 is a view in a direction perpendicular to the photosensor substrate 10, depicting an exemplary configuration of the sensor unit 1 according to the modification example 2. FIG. 12 is a sectional view taken along line XII-XII indicated in FIG. 11.

The modification example 2 is different from the first embodiment in the shape of an extended conductive film 61A. The extended conductive film 61 according to the first embodiment is provided only between the adjacent data lines G, whereas the extended conductive film 61A according to the modification example 2 extends in the second direction (the longitudinal direction) similarly to the source line S.

FIG. 11 exemplarily depicts the extended conductive film 61A decreased in width in the portion where the gate line Gj and the source line Si cross each other than the remaining portion. This configuration achieves suppression in capacitance between the source line Si connected to the extended conductive film 61A and the gate line Gj in the portion where the gate line Gj and the source line Si cross each other, in comparison to a case where the extended conductive film 61A is not decreased in width.

According to the modification example 2, the extended conductive film 61A and the source line S are provided at different levels and in parallel with each other. The source line S thus has the layered structure not partially but entirely, to achieve further decrease in resistance of the source line S.

Modification Example 3

Figure 13:
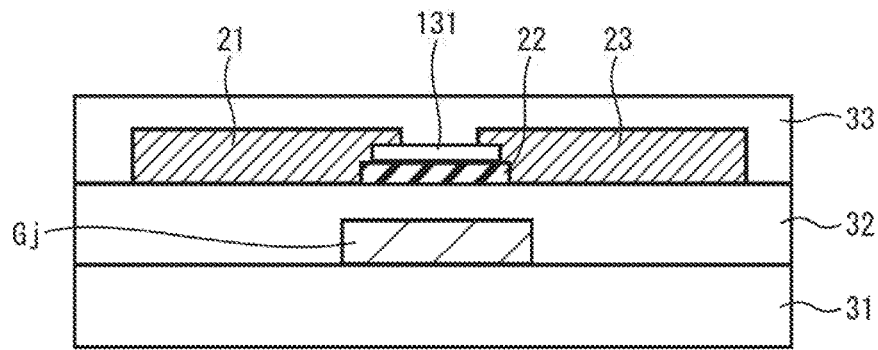
FIG. 13 is a sectional view depicting a configuration of a TFT according to a modification example 3.
Figure 14:
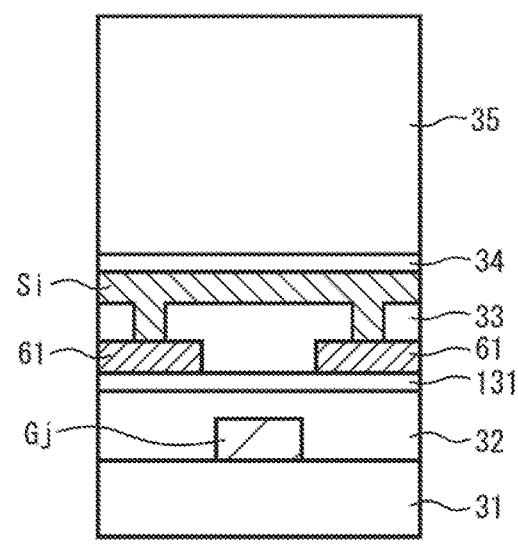
FIG. 14 is a sectional view of a portion where a gate line and a source line cross each other, according to the modification example 3.

FIG. 13 is a sectional view depicting a configuration of the TFT 2 according to the modification example 3. FIG. 13 does not depict the second passivation film 34 and the flattening film 35. FIG. 14 is a sectional view of the portion where the gate line Gj and the source line Si cross each other, according to the modification example 3.

The semiconductor layer 22 according to the modification example 3 is provided thereon with an etch stopper film 131. The etch stopper film 131 can be made of SiO$_2$ or the like. The etch stopper film 131 thus provided prevents the semiconductor layer 22 from being etched during formation of the source electrode 21 and the drain electrode 23 by etching.

Modification Example 4

The TFT 2 according to the first embodiment has a bottom gate configuration. The TFT 2 according to the modification example 4 has a top gate configuration.

Figure 15:
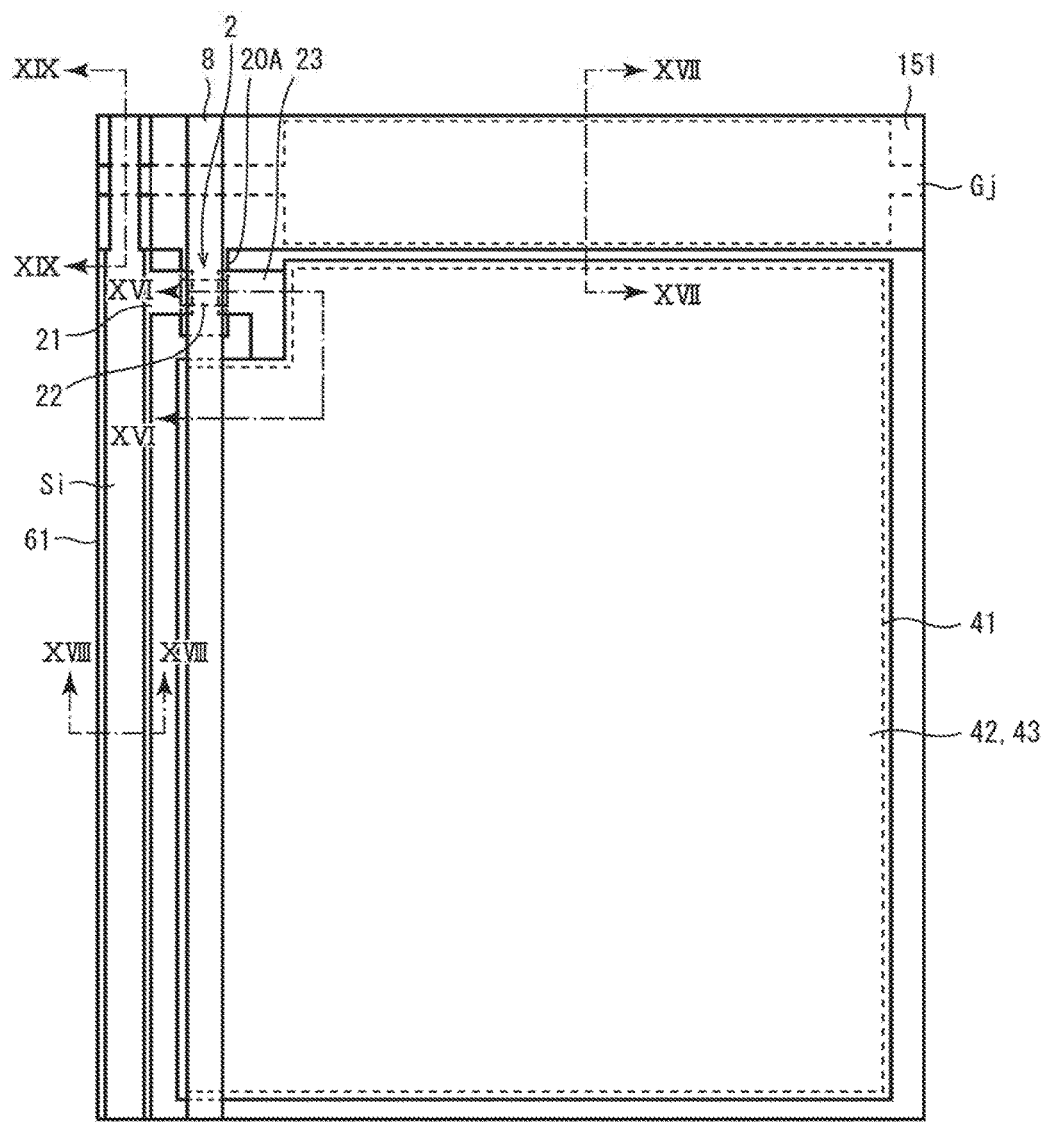
FIG. 15 is a view in a direction perpendicular to the photosensor substrate, depicting an exemplary configuration of a sensor unit according to a modification example 4.
Figure 16:
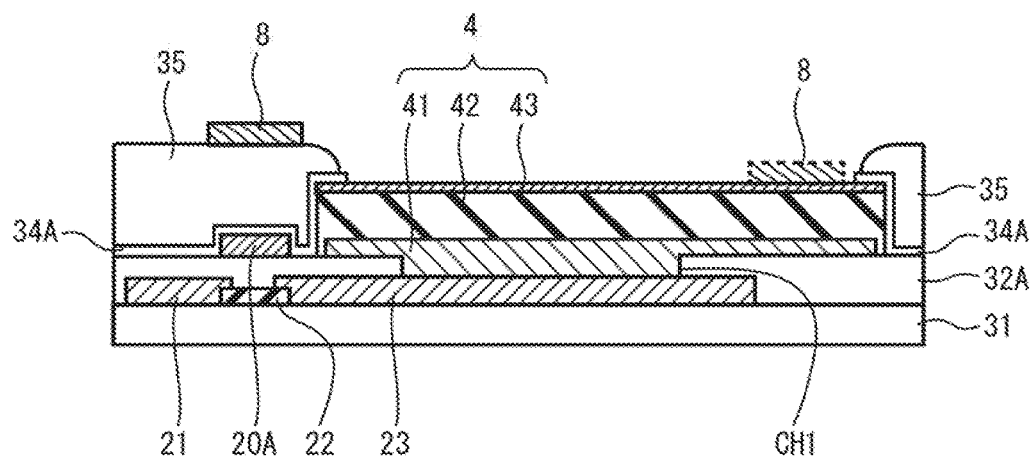
FIG. 16 is a sectional view taken along line XVI-XVI indicated in FIG. 15.
Figure 17:
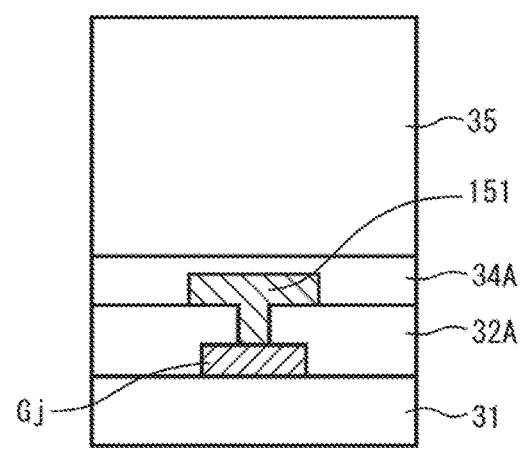
FIG. 17 is a sectional view taken along line XVII-XVII indicated in FIG. 15.
Figure 18:
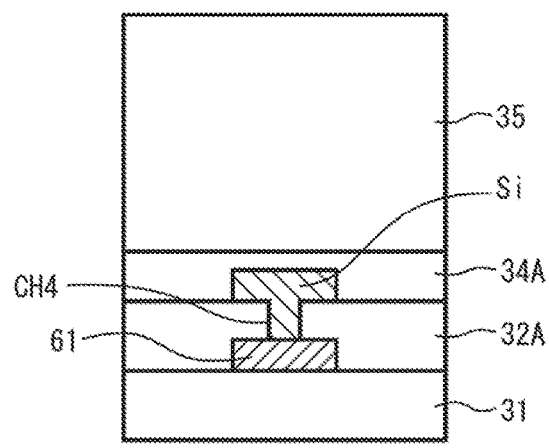
FIG. 18 is a sectional view taken along line XVIII-XVIII indicated in FIG. 15.
Figure 19:
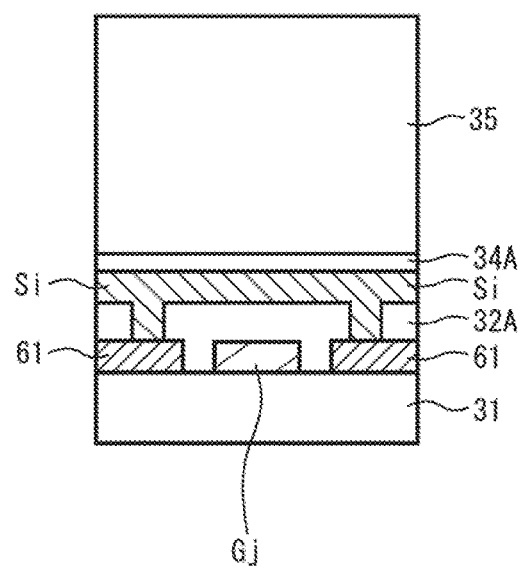
FIG. 19 is a sectional view taken along line XIX-XIX indicated in FIG. 15.

FIG. 15 is a view in a direction perpendicular to the photosensor substrate 10, depicting an exemplary configuration of the sensor unit 1 according to the modification example 4. FIG. 16 is a sectional view taken along line XVI-XVI indicated in FIG. 15. FIG. 17 is a sectional view taken along line XVII-XVII indicated in FIG. 15. FIG. 18 is a sectional view taken along line XVIII-XVIII indicated in FIG. 15. FIG. 19 is a sectional view taken along line XIX-XIX indicated in FIG. 15. The following description will mainly refer to constructional elements different from those of the first embodiment.

As depicted in FIG. 16, the source electrode 21, the semiconductor layer 22, and the drain electrode 23 are disposed on the substrate 31. There is provided a gate insulating film 32A serving as an insulating layer covering the source electrode 21, the semiconductor layer 22, and the drain electrode 23.

The gate insulating film 32A is provided thereon with a gate electrode 20A. The gate insulating film 32A is also provided thereon with the lower electrode 41, the semiconductor film 42, and the upper electrode 43 stacked in the mentioned order. Specifically, the gate electrode 20A and the lower electrode 41 are disposed at an identical layer level.

There is provided a passivation film 34A serving as an insulating layer covering the gate electrode 20A as well as the side surfaces and ends of the upper surface of the photodiode 4. The passivation film 34A is provided thereon with the flattening film 35.

As depicted in FIG. 17, the gate line Gj is provided on the substrate 31. The gate line Gj is covered with the gate insulating film 32A that is provided thereon with an extended conductive film 151. The gate insulating film 32A has a contact hole CH170. The extended conductive film 151 is connected to the gate line Gj via the contact hole CH170.

The extended conductive film 151 is provided between the two adjacent source lines S. Specifically, the gate line Gj has a two-layer structure in the portion between the two adjacent source lines S.

The source line Si according to the modification example 4 has a two-layer structure in the portion between the two adjacent data lines G as depicted in FIG. 18. Specifically, the substrate 31 is provided thereon with the extended conductive film 61. The extended conductive film 61 is provided between the two adjacent gate lines G. The extended conductive film 61 is covered with the gate insulating film 32A that is provided thereon with the source line Si.

FIGS. 16 to 19 each depict an exemplary configuration of a photosensor substrate provided with top gate TFTs. The gate line Gj and the extended conductive film 151 are thus not limited to those depicted in FIG. 17 in terms of their locations and stacked orders. Furthermore, the source line Si and the extended conductive film 61 are not limited to those depicted in FIG. 18 in terms of their locations and stacked orders.

Exemplary Application to X-ray Image Detection Device

Figure 20:
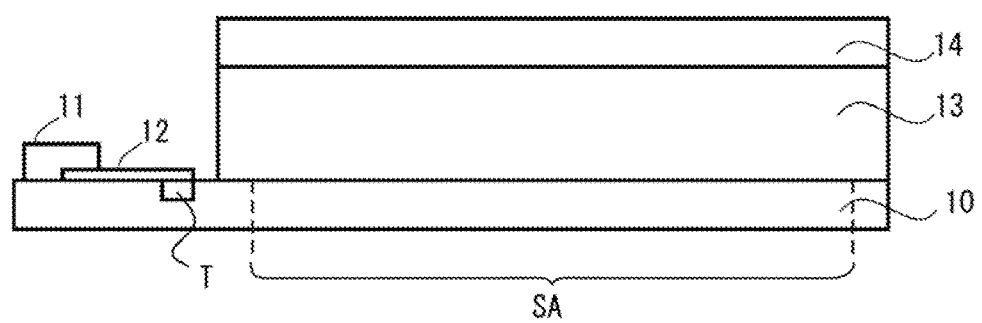
FIG. 20 is a view depicting an exemplary configuration of an X-ray image detection device including the photosensor substrate of FIG. 1.

FIG. 20 is a view depicting an exemplary configuration of an X-ray image detection device including the photosensor substrate 10 of FIG. 1. FIG. 20 depicts a layer configuration in a plane perpendicular to the plane of the photosensor substrate 10. The photosensor substrate 10 is provided with a scintillator layer 13 positioned to be overlapped with the sensor area. The scintillator layer 13 can be made of a fluorescent material that converts X-rays to visible rays. Examples of the fluorescent material include cesium iodide (CsI). The scintillator layer 13 can be obtained by direct film formation, such as attachment or vapor deposition, to a surface of the photosensor substrate 10. The scintillator layer 13 can be provided thereon with a protective layer 14 covering the scintillator layer 13. This configuration achieves a flat panel detector (FDP) for an X-ray image.

The terminal parts T of the photosensor substrate 10 are each connected with an electronic component 11 via a line 12. The electronic component 11 can be configured by a semiconductor chip including a circuit configured to process signals transmitted to the sensor units 1 or signals outputted from the sensor units 1. The circuit connected to the terminal part T is not necessarily mounted as the semiconductor chip. The circuit can be mounted on the photosensor substrate 10 in accordance with the chip on glass (COG) method or the like, or can be provided at flexible printed circuits (FPCs) connected to the terminal part T.

As described above, the embodiment of the present invention relates also to the X-ray image detection device including the photosensor substrate and a wavelength conversion layer overlapped with the photosensor substrate.

The embodiment and the modification examples described above are merely exemplified for implementation of the present invention. The present invention should not be limited to the embodiment and the modification examples, and can be implemented with appropriate modifications to the embodiment and the modification examples, without departing from the spirit of the present invention.

For example, the above embodiment exemplifies the photosensor substrate including the active-matrix substrate and the photodiodes 4 disposed thereon. The active-matrix substrate can alternatively be provided with no photodiode 4. Such an active-matrix substrate is applicable to a display device like a liquid crystal display or an organic EL display.

The gate line G according to the first embodiment has the three-layer structure. The gate line G can alternatively have two layers, or four or more layers. The source line S according to the first embodiment has the two-layer structure. The source line S can alternatively have three or more layers.

Still alternatively, only one of the gate line G and the source line S can have a layered structure with connection to the extended conductive film via a contact hole provided in an insulating layer.

The photodiode 4 is alternatively connected with a plurality of (two, three, or more) TFTs. For example, the TFT including the semiconductor layer made of an oxide semiconductor has high mobility and can thus be adopted as a TFT of an amplifier circuit (e.g. a source follower circuit (a drain grounded circuit)). The amplifier circuit can be provided with a plurality of TFTs corresponding to a single pixel.

Each of the sensor units 1 can further have storage capacitance (CS) (not depicted). The photodiode 4 can be connected with the TFT and the storage capacitance. Each pixel can be provided with at least one TFT, at least one photodiode, and at least one storage capacitance.

The photodiode 4 according to the above embodiment is configured by the semiconductor layers of the PIN structure. The photodiode 4 can alternatively have a PN structure or a Schottky structure. Furthermore, the semiconductor configuring the photodiode 4 is not limited to amorphous silicon. Moreover, the photoelectric conversion element can configure an MIS sensor.

REFERENCE NUMERALS

1 Sensor unit
10 Photosensor substrate
2 TFT (exemplifying transistor)
20, 20A Gate electrode
21 Source electrode
22 Semiconductor layer
23 Drain electrode
31 Substrate
34 Second passivation film
34A Passivation film
35 Flattening film
41 Lower electrode
42 Semiconductor film
43 Upper electrode
4 Photodiode (exemplifying photoelectric conversion element)
51, 51A, 52, 61, 61A, 151 Extended conductive film
S Source line
G Gate line

The invention claimed is:

1. An active-matrix substrate comprising:
a substrate;
a plurality of first lines disposed on the substrate and extending in a first direction;
a plurality of second lines disposed on the substrate and extending in a second direction different from the first direction;
a transistor disposed correspondingly to each of intersection points of the first lines and the second lines, and connected to a corresponding one of the first lines and a corresponding one of the second lines;
an insulating layer;
an extended conductive film; and
a photoelectric conversion element disposed correspondingly to each of the intersection points of the first lines and the second lines and connected to the transistor;
wherein
at least one of the first lines and the second lines each have a layered structure with connection to the extended conductive film via a contact hole provided in the insulating layer,
the extended conductive film includes a first-line extended conductive film and a second-line extended conductive film,
the first lines are connected to the first-line extended conductive film,
the second lines are connected to the second-line extended conductive film,
the first-line extended conductive film includes a first-line first extended conductive film connected to the first lines, and a first-line second extended conductive film extending in parallel with the first-line first extended conductive film at a layer level different from the first-line first extended conductive film and connected to the first-line first extended conductive film via a contact hole,
when viewed in a direction perpendicular to the substrate, the first-line first extended conductive film and the first-line second extended conductive film extend in parallel to the first lines in the first direction and substantially overlap the first lines,
when viewed in the direction perpendicular to the substrate, the second-line extended conductive film extends in parallel to the second lines in the second direction and substantially overlap the second lines, and
none of the first-line first extended conductive film, the first-line second extended conductive film, the first lines, the second-line extended conductive film and the second lines overlaps the photoelectric conversion element.

2. The active-matrix substrate according to claim 1, wherein
the first-line first extended conductive film is provided at a layer level identical to the second-line extended conductive film, and
the first-line second extended conductive film is provided at a layer level identical to the second lines.

3. The active-matrix substrate according to claim 1, wherein
the first-line extended conductive film is disposed between two adjacent ones of the second lines, and
the second-line extended conductive film is disposed between two adjacent ones of the first lines.

4. The active-matrix substrate according to claim 3, wherein
the insulating layer includes a passivation film covering the transistor, and a flattening film facing the transistor with the passivation film interposed therebetween, and
the passivation film and the flattening film are disposed between the first lines and the second lines in portions where the first lines and the second lines cross each other when viewed in a direction perpendicular to the substrate.

5. The active-matrix substrate according to claim 1, wherein
the transistor includes a gate electrode, a gate insulating film, a semiconductor layer positioned to face the gate electrode with the gate insulating film interposed therebetween, and a drain electrode and a source electrode connected to the semiconductor layer and facing each other in a direction parallel to the substrate, and
the gate electrode of the transistor is disposed between the gate insulating film and the substrate.

6. The active-matrix substrate according to claim 1, wherein
the first-line first extended conductive film and the first-line second extended conductive film are electrically connected only to the first lines, and
the second-line extended conductive film is electrically connected only to the second lines.

* * * * *